(12) United States Patent
Wells

(10) Patent No.: US 8,268,730 B2
(45) Date of Patent: Sep. 18, 2012

(54) METHODS OF MASKING SEMICONDUCTOR DEVICE STRUCTURES

(75) Inventor: David H. Wells, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 262 days.

(21) Appl. No.: 12/477,551

(22) Filed: Jun. 3, 2009

(65) Prior Publication Data

US 2010/0308438 A1 Dec. 9, 2010

(51) Int. Cl.
*H01L 21/31* (2006.01)

(52) U.S. Cl. .. 438/763; 438/758; 438/761; 257/E21.023

(58) Field of Classification Search .................. 438/758, 438/761, 763; 257/618, E21.023
See application file for complete search history.

(56) References Cited

U.S. PATENT DOCUMENTS

| | | | |
|---|---|---|---|
| 5,119,127 A * | 6/1992 | Watanuki | 355/53 |
| 5,789,306 A | 8/1998 | Roberts et al. | |
| 5,883,006 A * | 3/1999 | Iba | 438/712 |
| 6,303,275 B1 | 10/2001 | Coles et al. | |
| 6,440,638 B2 | 8/2002 | Golz et al. | |
| 6,440,644 B1 | 8/2002 | Sato et al. | |
| 6,607,984 B1 | 8/2003 | Lee et al. | |
| 7,071,072 B2 * | 7/2006 | Mo et al. | 438/424 |
| 7,842,558 B2 * | 11/2010 | Juengling | 438/135 |
| 7,911,728 B2 * | 3/2011 | Albrecht et al. | 360/75 |
| 2006/0211260 A1 | 9/2006 | Tran et al. | |
| 2007/0049011 A1 | 3/2007 | Tran | |
| 2007/0238299 A1 | 10/2007 | Niroomand et al. | |
| 2007/0259457 A1 | 11/2007 | DiCarlo | |
| 2008/0085612 A1 * | 4/2008 | Smythe et al. | 438/787 |
| 2010/0041204 A1 * | 2/2010 | Kiehlbauch et al. | 438/397 |

* cited by examiner

*Primary Examiner* — Matthew Landau
*Assistant Examiner* — Colleen E Snow
(74) *Attorney, Agent, or Firm* — TraskBritt

(57) ABSTRACT

A method for fabricating semiconductor device structures includes forming a non-conformal mask over a surface of a substrate. Non-conformal mask material with a planar or substantially planar upper surface is formed on the surface of the substrate. The planarity or substantial planarity of the non-conformal material eliminates or substantially eliminates distortion in a "mask" formed thereover and, thus, eliminates or substantially eliminates distortion in any mask that is subsequently formed using the pattern of the mask. In some embodiments, mask material of the non-conformal mask does not extend into recesses in the upper surface of the substrate; instead it "bridges" the recesses. Semiconductor device structures that include non-conformal masks and semiconductor device structures that have been fabricated with non-conformal masks are also disclosed.

14 Claims, 8 Drawing Sheets

METHODS OF MASKING SEMICONDUCTOR DEVICE STRUCTURES

TECHNICAL FIELD

In various embodiments, the present invention relates generally to non-conformal masks. In more specific embodiments, the present invention relates to masks with substantially planar upper surfaces. In some embodiments, a non-conformal mask may bridge recesses in underlying semiconductor device structures. The substantially planarity of the upper surfaces of such masks enables the precise and accurate transfer of patterns from the masks into one or more material layers of the semiconductor device structures.

BACKGROUND

Advances in semiconductor device technologies have included the development of a number of complex, intricate structures. Examples of such structures include cross-hair cells, which may be used in dynamic random access memory (DRAM) devices, the epi-diodes of phase-change random access memory (PCRAM) devices, and pseudo silicon-on-insulator (PSOI) structures. Fabrication of these and other structures typically requires the use of two or more masks, through which material is removed to define the desired structure or structures.

Once material has been removed through a first mask, the upper, or "active," surface of the substrate typically includes a number of recesses. As a consequence of the presence of these recesses, one of two undesirable results will occur when conventional conformal mask fabrication processes are used to form a subsequent mask: (1) the recesses must be filled with a sacrificial material before the layer of mask material is applied and the subsequent mask is formed therefrom; or (2) a layer of mask material, such as a photoresist, that will be used to define the subsequent mask will conform to the topography of the semiconductor device structure. When the recesses are not filled before mask material is applied, mask material enters the recesses, resulting in a layer of mask material with a nonplanar surface. The degree of nonplanarity corresponds to the size and/or density of recesses, with the nonplanarity being more pronounced when a substrate includes larger and/or more densely arranged recesses.

When a conformal mask is formed, different regions of the layer of mask material are located at different elevations. When a layer of photoresist is applied to the layer of mask material, it too will have different regions that are located at different elevations. Unfortunately, the tools that are used to expose the photoresist have a narrow focal plane, which may not coincide with all areas of the photoresist, causing some areas to be exposed to a blurred radiation pattern. When the exposing radiation is blurred, the precision with which mask features (e.g., solid edges, apertures, etc.) may be formed through the photoresist is reduced, as is the precision with which these features may be transferred into the mask material from which the subsequent mask will be defined.

When the recesses are filled before the mask material is applied, the semiconductor device structure must be subjected to a number of additional processes, including material deposition, planarization, and material removal processes, all of which undesirably add to the overall cost of fabrication, as well as increase the probability that the resulting semiconductor devices will be damaged.

DETAILED DESCRIPTION

Figure 1:
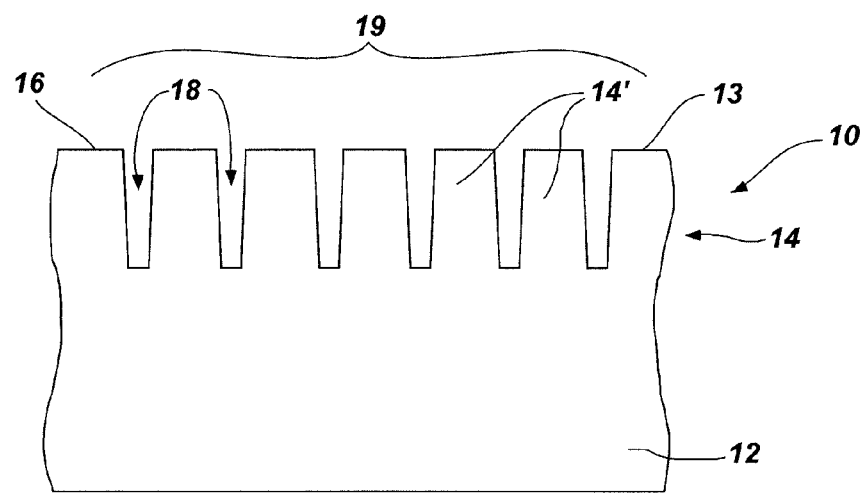
FIGS. 1 through 6 are cross-sectional representations of an embodiment of a process for forming a non-conformal mask over a substrate.

FIGS. 1 through 7 illustrate an embodiment of a method for fabricating a mask 30 (FIG. 6) over a substrate 10. As shown in FIG. 1, substrate 10 comprises a semiconductor substrate 12, such as a full or partial wafer of semiconductor material (e.g., silicon, gallium arsenide, indium phosphide, etc.) or a so-called silicon-on-insulator (SOI) type substrate (e.g., silicon-on-ceramic (SOC), silicon-on-diamond (SOD), silicon-on-glass (SOG), silicon-on-sapphire (SOS), etc.).

In some embodiments, a semiconductor substrate 12 upon which a mask is to be fabricated carries one or more materials 14 on its upper surface 13. In the depicted embodiment, recesses 18 extend into an upper surface 16 of substrate 10; i.e., into an upper surface of an uppermost material 14. In some embodiments, recesses 18 define semiconductor device features 14' from one or more materials 14. In more specific embodiments, recesses 18 may be part of a first pattern 19 that has been defined in substrate 10 or from materials 14.

Figure 2:
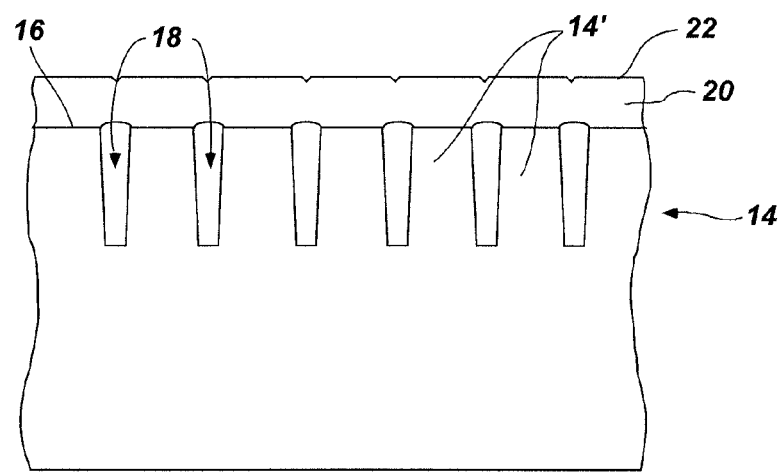

As shown in FIG. 2, a non-conformal film 20 is formed on upper surface 16. Non-conformal film 20 may comprise a material that will serve as a mask 30 (FIG. 6) for subsequently patterning one or more materials 14 or other semiconductor device features 14'. In some embodiments, non-conformal film 20 may comprise a carbon-based material. In more specific embodiments, non-conformal film 20 may comprise a so-called "transparent carbon" (TC) or an amorphous carbon. In other embodiments, another suitable mask material, such as a silicon nitride that has been doped with hydrogen, may be used to form non-conformal film 20.

Non-conformal film 20 may be formed by processes that impart it with an upper surface 22 that is, at least, more planar than the upper surface 16 over which non-conformal film 20 has been formed. In some embodiments, upper surface 22 of non-conformal film 20 may be substantially planar or even planar. The planarity or substantial planarity of upper surface 22 may be achieved solely by way of the process by which non-conformal film 20 is formed, without any further processing (e.g., planarization, polishing, etching, etc.) of upper surface 22. In a specific embodiment, a non-conformal film 20 with an upper surface 22 that is substantially planar may result from embodiments of processes where transparent carbon is deposited by low temperature plasma-enhanced chemical vapor deposition (PECVD) processes. Other processes may, of course, also be used to form a non-conformal film 20 with a substantially planar surface, including processes for forming non-conformal film 20 from materials other than transparent carbon.

Some embodiments of processes that are used to form non-conformal film 20 may result in a structure that "bridges" one or more recesses 18, covering an opening of each covered recess 18 without completely lining, or substantially entering, that covered recess 18. In such embodiments, the processes that are used to form non-conformal film 20 and the material from which non-conformal film 20 is formed are considered in conjunction with the lateral dimensions (e.g., distance across, diameter, etc.) of recesses 18, and tailored to minimize or prevent sagging of portions of non-conformal film 20 that bridge recesses 18 and to impart non-conformal film 20 with a planar or substantially planar upper surface 22. In embodiments where non-conformal film 20 is formed from transparent carbon, the transparent carbon may be deposited by known low temperature PECVD processes. In even more specific embodiments, PECVD may be used to deposit transparent carbon in such a way that it will bridge recesses 18 that are about 70 nm wide, about 100 nm wide, or even about 120 nm wide, and that are spaced about the same distance apart from one another (i.e., have about the same pitch). Of course, other embodiments of processes for forming a non-conformal film 20 that will bridge recesses 18 without substantially entering into the recesses 18, including processes for forming non-conformal film 20 from materials other than transparent carbon, are also within the scope of the present invention.

Figure 3:
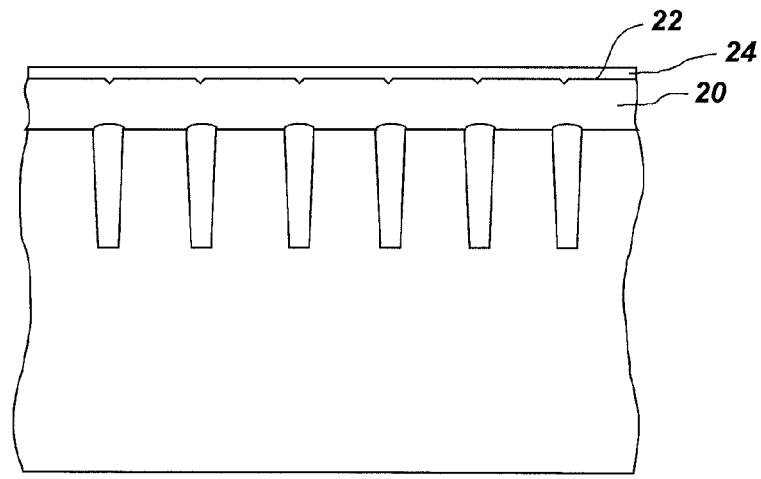

In some embodiments, a dielectric anti-reflective coating (DARC) film 24 of a known type may be formed on upper surface 22 of non-conformal film 20, as illustrated by FIG. 3. A DARC film 24 is particularly useful in embodiments where photo processes will subsequently be used to form a mask 28 (FIG. 5) over non-conformal film 20. DARC film 24 may be formed from any suitable material by any suitable process known in the art. In a specific embodiment, DARC film 24 may comprise a silicon oxynitride (SiON) film with a stoichiometry that is tailored to minimize reflectance during subsequent photo processing. As DARC film 24 is formed on a planar or substantially planar upper surface 22 of non-conformal film 20, an upper surface of DARC film 24 may also be planar or substantially planar.

Figure 3A:
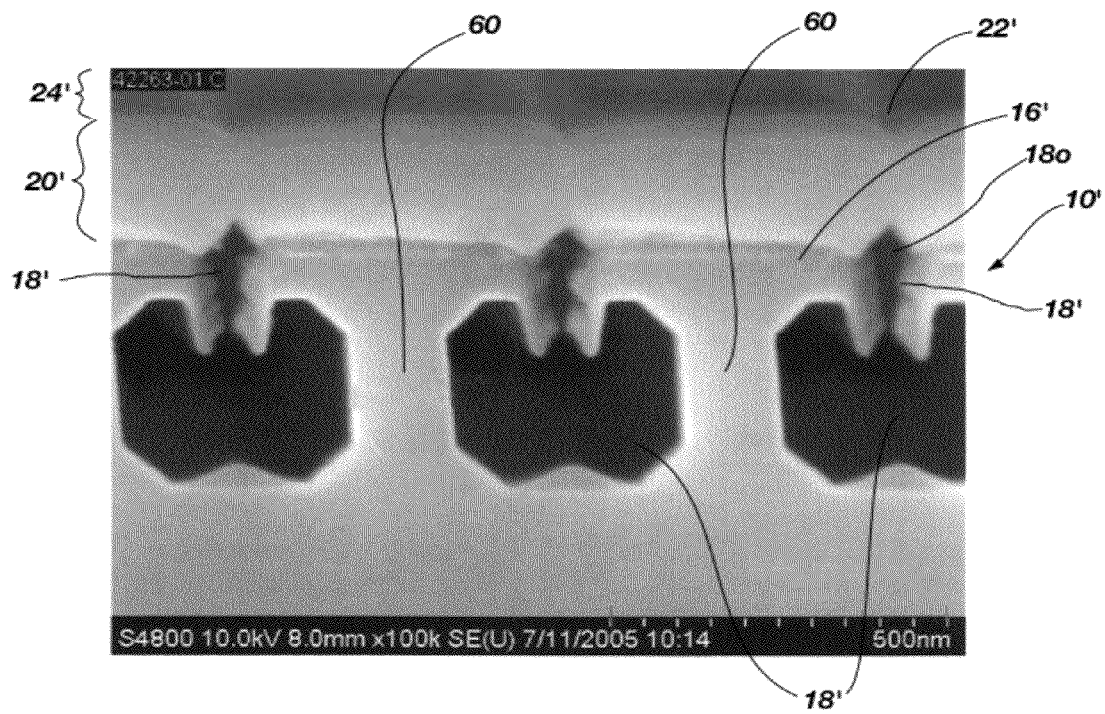
FIG. 3A is a scanning electron micrograph of an embodiment of a structure that includes a substrate with a non-conformal film of mask material on its upper surface, with the non-conformal film bridging recesses in the upper surface of the substrate.

FIG. 3A is a scanning electron micrograph of a specific embodiment of a structure that may be fabricated using the foregoing techniques. In that structure, substrate 10' includes recesses 18' with undercut regions that are used to isolate adjacent columns of "pseudo silicon-on-insulator" ("PSOI") structures 60 from one another. A non-conformal transparent carbon film 20' having a thickness of about 2,000 Å has been formed over an upper surface 16' of substrate 10,' and bridges openings $18_O$ of recesses 18' in upper surface 16'. A DARC film 24' with a thickness of about 320 Å resides upon a substantially planar upper surface 22' of transparent carbon film 20'.

Figure 4:
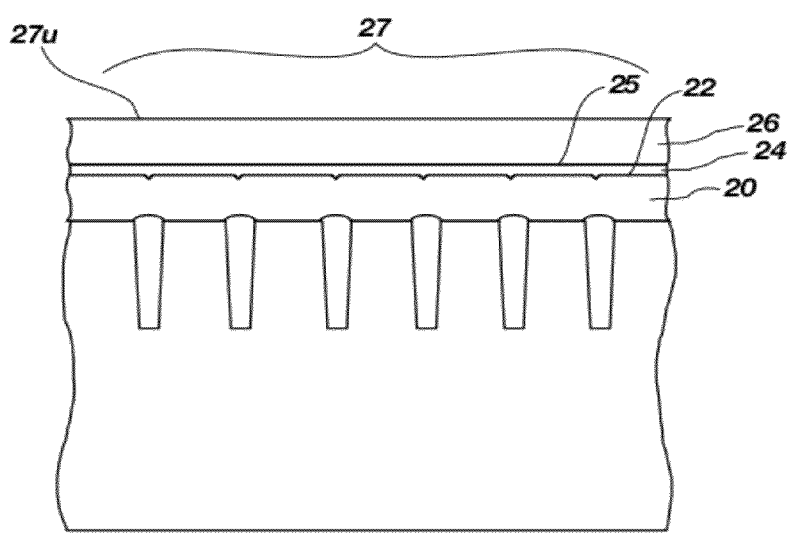

Once non-conformal film 20 and DARC film 24, if any, have been formed, a "soft" mask material 26 may be applied to or over upper surface 22 of non-conformal film 20, as depicted by FIG. 4. In embodiments that lack a DARC film 24, mask material 26 may be formed directly on upper surface 22 of non-conformal film 20. In embodiments where a DARC film 24 resides upon upper surface 22 of non-conformal film 20, mask material 26 may be formed on upper surface 25 of DARC film 24. Various embodiments of mask materials that may be used to form mask material 26 include, without limitation, uncured photoresists, thermoplastic materials, metals, or any other suitable materials.

Figure 5:
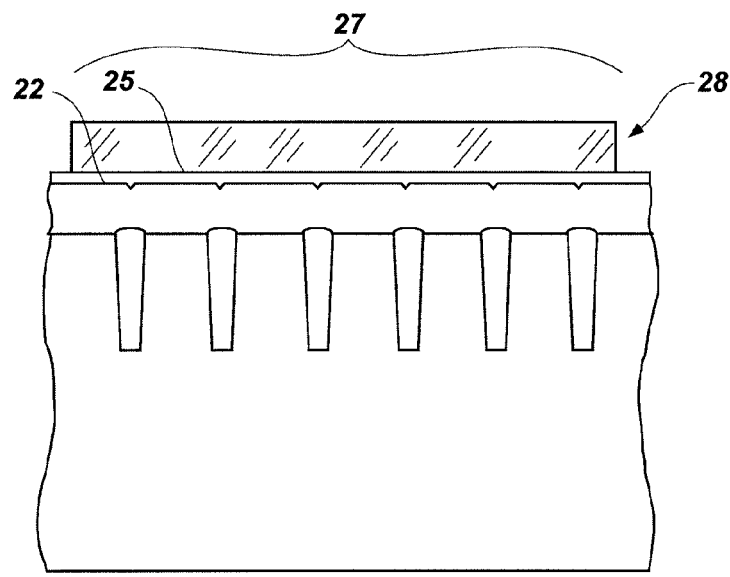

As depicted by FIG. 5, a mask 28 may be defined from mask material 26 by patterning the mask material 26 (FIG. 4). Since mask material 26 is formed over a planar or substantially planar upper surface 22, 25, a region 27 (see also FIG. 4) of mask material 26 that is to be patterned, or an area of mask material 26 in which patterning (e.g., apertures, etc.) of mask 28 is to be located, may itself be planar or substantially planar, or have a thickness that is uniform or substantially uniform. Thus, distortion of mask 28 may be minimized or eliminated, providing optimal control over the critical dimensions (CDs) of mask 28 and of any subsequently formed mask.

In some embodiments, where mask material 26 (FIG. 4) comprises uncured photoresist, conventional photolithography processes may be used to expose and develop the mask material 26, with mask 28 being the result of such processes. In embodiments where conventional photolithography processes are used to form mask 28 from mask material 26, the planarity or substantial planarity of mask material 26 or its uniformity or substantial uniformity in thickness may enable a depth of focus (DOF) of radiation emitted by a lithography tool to coincide with mask material 26 across the entirety of region 27.

In other embodiments, the planar or substantially planar upper surface $27_U$ (FIG. 4) of region 27 enables the use of so-called nanoimprint lithography techniques to form mask 28 from mask material 26 (FIG. 4). Specifically, due to the planarity or substantial planarity of upper surface $27_U$, all of the imprint regions of a nanoimprint mold (not shown) may come into simultaneous or substantially simultaneous contact with the entire planar or substantially planar upper surface $27_U$. The uniform or substantially uniform thickness of region 27 enables all areas of the nanoimprint mold to affect all areas of region 27 in a uniform or substantially uniform manner, resulting in a distortion-free or substantially distortion-free mask 28.

Appropriate nanoimprint lithography techniques may be effected in a manner known in the art to define mask 28 from mask material 26. In more specific embodiments, known photo nanoimprint lithography techniques may be used to form a mask 28 from a mask material 26 that comprises an uncured photoresist, known thermoplastic nanoimprint lithography techniques may be used to form a mask 28 from a mask material 26 that comprises a thermoplastic material, known electrochemical nanoimprint lithography techniques may be used to form a mask 28 from a mask material 26 that comprises a metal, and guided self-assembly processes may be used to form a mask 28 from monolayers of appropriate mask materials 26.

Figure 6:
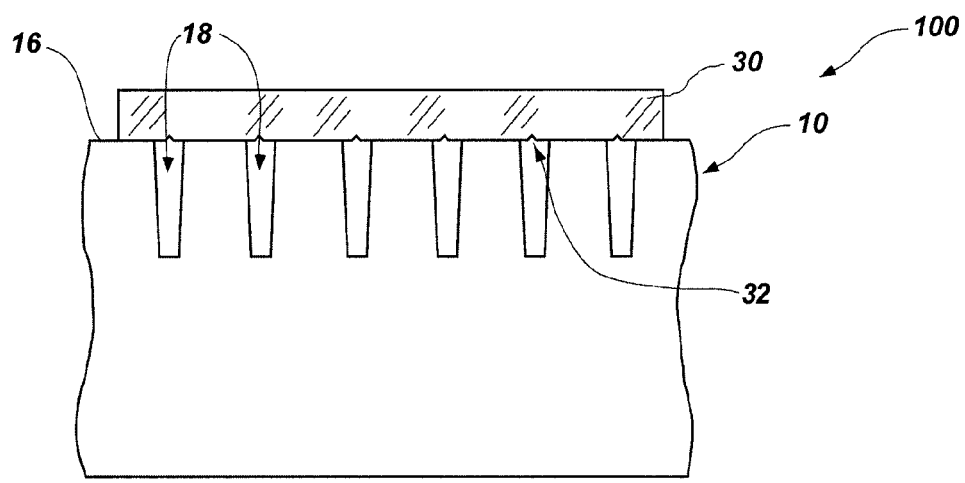

The masks 28 that result from these or other suitable processes may be used in conjunction with a suitable material removal process, as shown in FIG. 6, to define a mask 30 from non-conformal film 20 (FIGS. 2, 3 and 4). In embodiments where non-conformal film 20 comprises transparent carbon, known etching processes may be used to remove material from non-conformal film 20 and, thus, to define a pattern therefrom, resulting in mask 30.

Mask 30 may, in some embodiments, lack distortion, other than minimal distortion that may occur as an artifact of the process used to form mask 28 (FIGS. 4 and 5). In embodiments where mask 28 is formed by photolithography techniques, minimal distortion may be present at locations of mask 30 that correspond to peripheral regions of mask 28, which, in turn, correspond to the outer periphery of the field of exposure of a reticle, or photomask, through which radiation is directed to form mask 28.

In other embodiments, mask 30 may substantially lack distortion. Stated another way, distortion in mask 30 may be limited to minimal distortion, such as that resulting from the process by which mask 28 is formed, and nonplanarities that may occur in one or both of mask material 26 and non-conformal film 20.

FIG. 6 shows an embodiment of a structure 100 in which a mask 30 overlies upper surface 16 of substrate 10, as well as recesses 18 within upper surface 16. At some locations, apertures 32 of mask 30 overlap and communicate with recesses 18. In the depicted embodiment, recesses 18 comprise parts of a first pattern 19 (FIG. 1) that has already been formed in upper surface 16 of substrate 10, while mask 30 includes apertures 32 that overlap, or "cross," recesses 18 of first pattern 19 at some locations.

Figure 7:
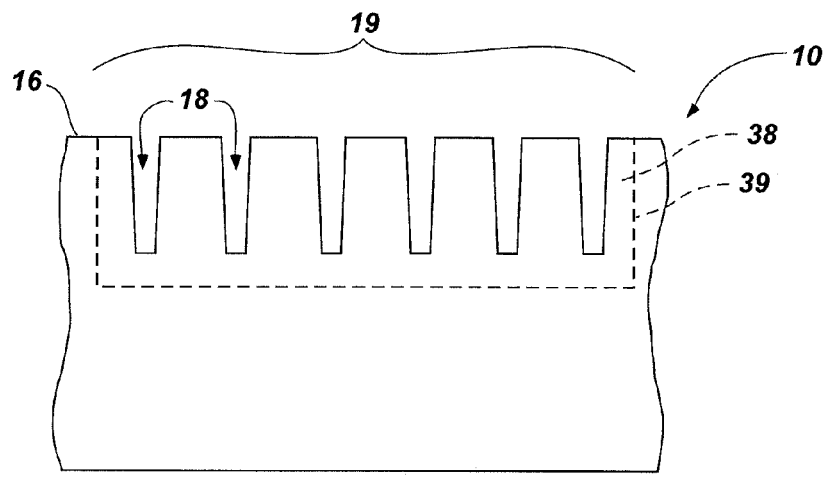
FIG. 7 is a cross-sectional representation showing an embodiment of a process for removing material through an embodiment of a mask of the present invention.

As depicted by FIG. 7, such an embodiment of mask 30 (FIG. 6) may be used with known material removal processes (e.g., etch processes, etc.) to form a second pattern 39 or recesses 38 in upper surface 16, with second pattern 39 "crossing" and communicating with recesses 18 of first pattern 19.

Figure 8:
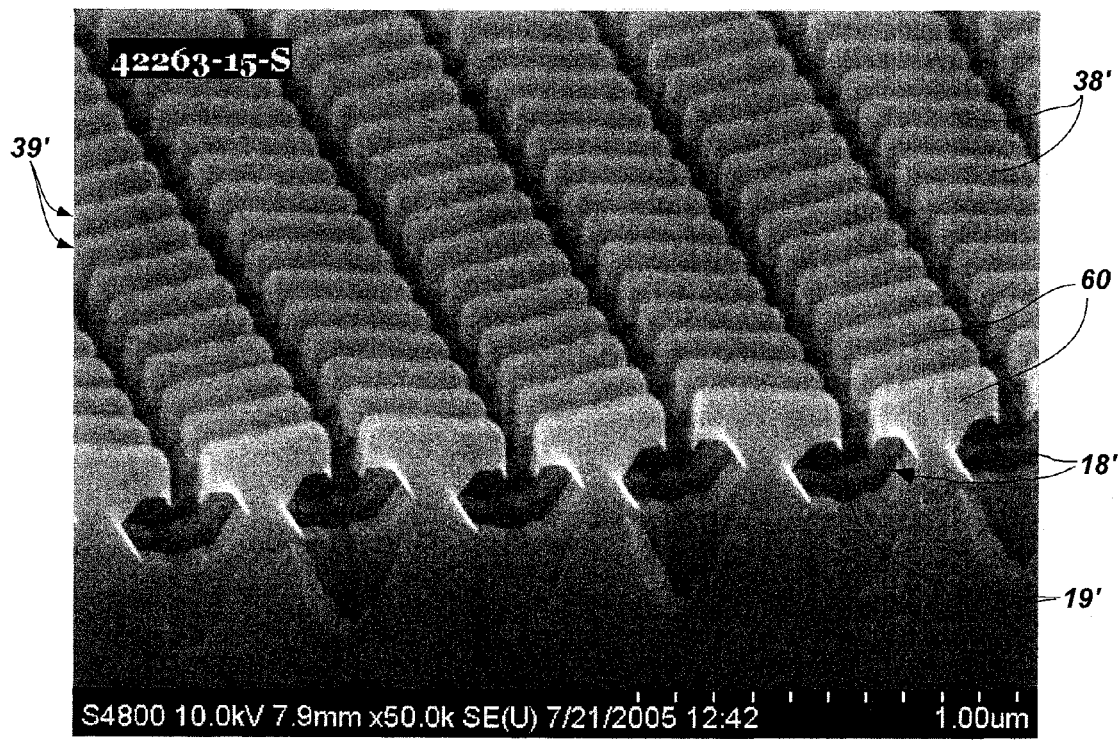
FIG. 8 is a scanning electron micrograph of an embodiment of a structure that has been fabricated by employing embodiments of the present invention.

In some embodiments, material of substrate 10 may be removed through mask 30 to directly pattern substrate 10, as depicted by FIG. 7. Conventional material removal processes (e.g., etch processes, etc.) may be used to remove material of substrate 10 through mask 30. A specific embodiment of a result of a process in which material of substrate 10 is removed through mask 30, as depicted by FIG. 7, is shown in FIG. 8. In FIG. 8, which is a scanning electron micrograph of an array of PSOI structures 60 (incomplete portions of which are illustrated by FIG. 3A), a first pattern 19' comprises recesses 18' for shallow trench isolation (STI) structures that will electrically isolate columns (in the depicted orientation) of PSOI structures 60 from one another, while a second pattern 39' comprises recesses 38' that separate each column into a plurality of discrete PSOI structures 60 that are electrically isolated from one another.

Figure 9:
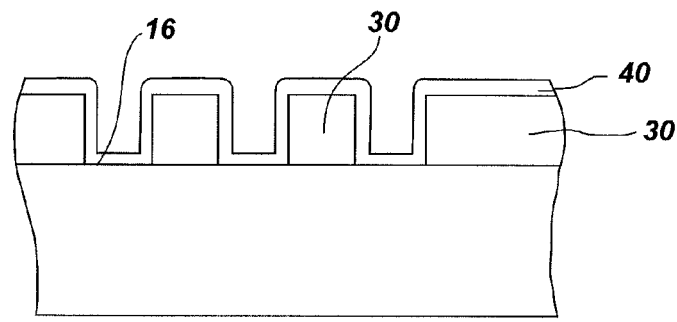
FIGS. 9 through 11 are cross-sectional representations that illustrate an embodiment of a pitch multiplication process that uses an embodiment of a non-conformal mask of the present invention.
Figure 10:
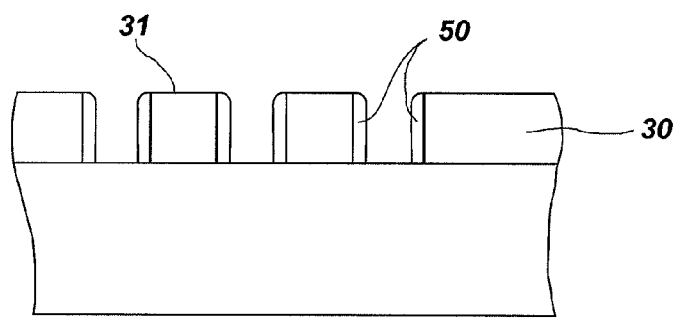
Figure 11:
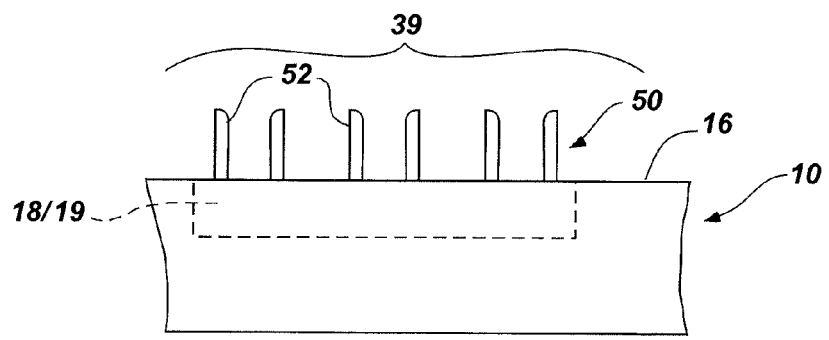

In other embodiments, such as that shown in FIGS. 9 through 11, mask 30 may comprise an intermediate mask for use in pitch multiplication (e.g., pitch doubling, etc.) processes. In one such embodiment, illustrated by FIG. 9, known processes may be used to form a conformal layer 40 of another mask material over mask 30 and portions of upper surface 16 that are exposed through mask 30. Conformal layer 40 may be formed from a material that will withstand processes that remove the material of mask 30. As depicted by FIG. 10, regions of conformal layer 40 that overlie mask 30 may be removed. In some embodiments, known etch techniques (e.g., anisotropic etch processes, etc.) may be used to remove these portions of conformal layer 40, forming a reduced-pitch mask 50 through which upper surfaces 31 of mask 30 are exposed. Thereafter, the material of mask 30 may be removed through, and with selectivity over, the material of reduced-pitch mask 50, as shown in FIG. 11. Reduced-pitch mask 50 may then be used, in conventional material removal processes (e.g., etch processes, etc.) to pattern substrate 10, as known in the art.

Like mask 30, reduced-pitch mask 50 may include apertures 52 that overlap, or "cross," and communicate with recesses 18 in upper surface 16 of substrate 10. Thus, in some embodiments, reduced-pitch mask 50 may be used to define a second pattern 39 in upper surface 16 that crosses a previously defined first pattern 19 in upper surface 16.

Figure 12:
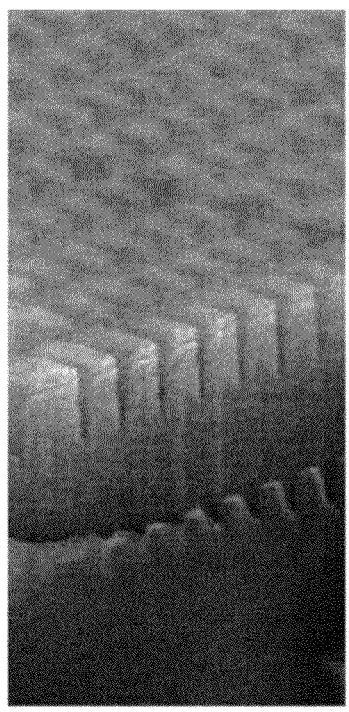
FIGS. 12 through 14 are scanning electron micrographs depicting an embodiment of a multi-elevation structure fabricated using embodiments of the present invention.
Figure 13:
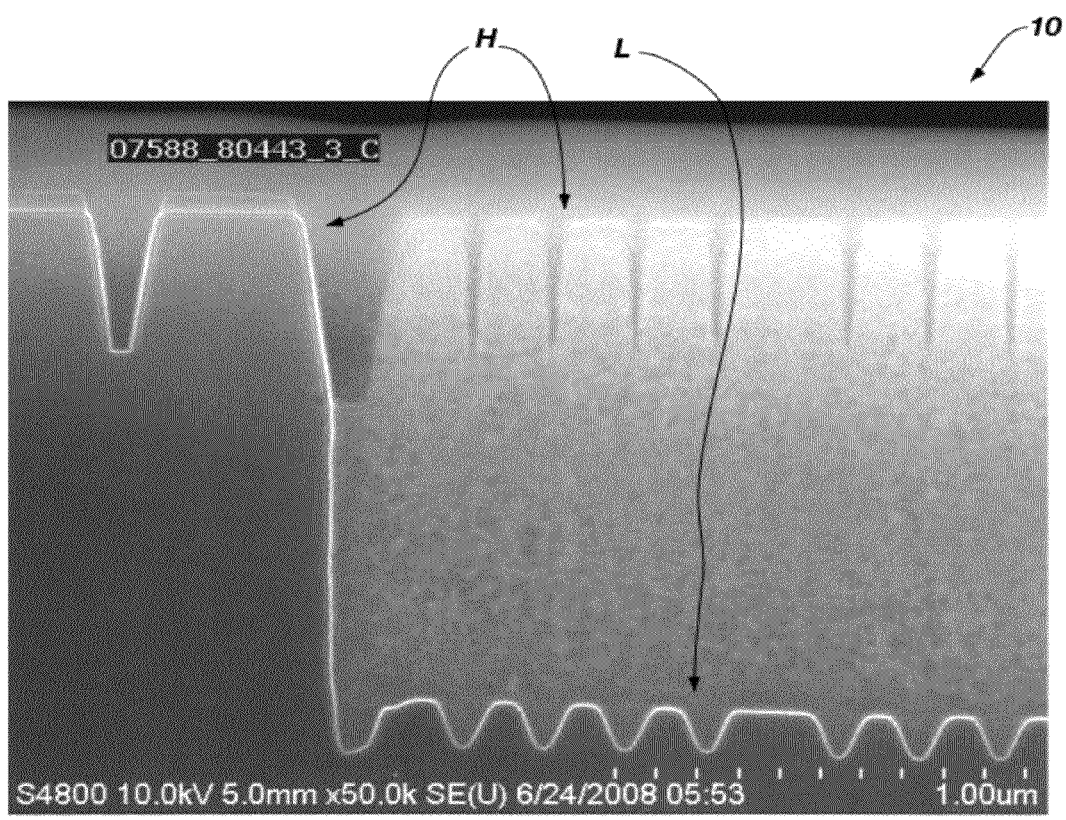
Figure 14:
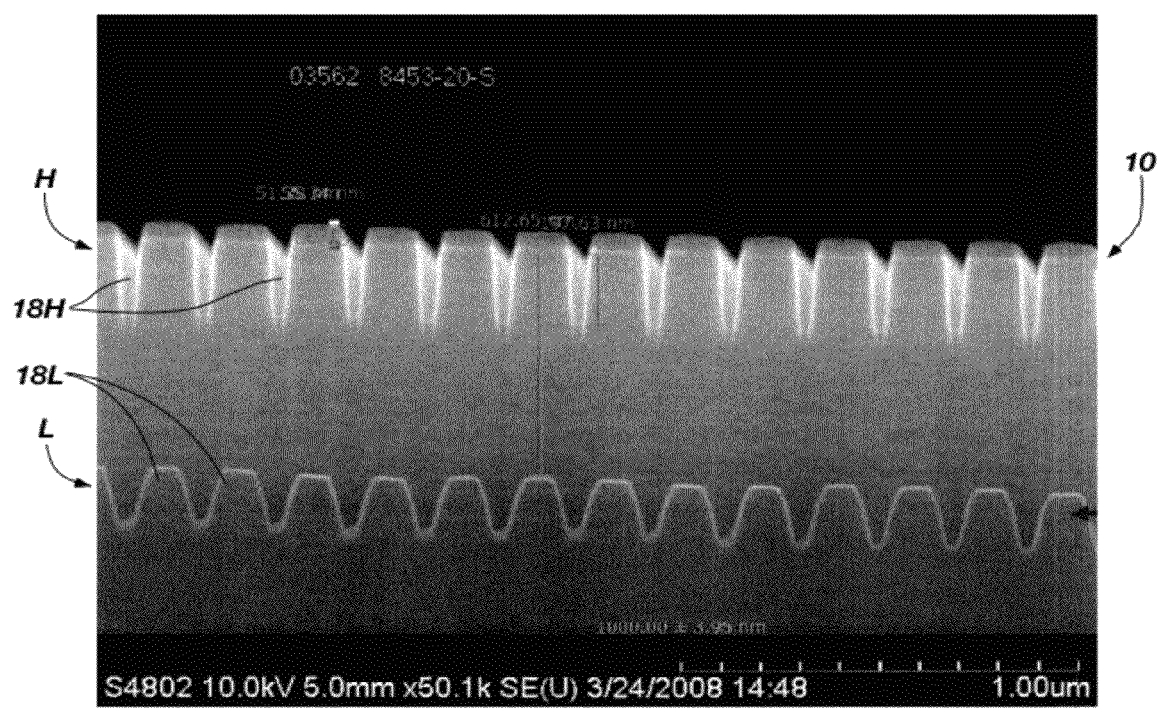

FIGS. 12 through 14 are scanning electron micrographs depicting a substrate 10 with recesses 18L, 18H that have been formed at two different elevations L and H by forming a non-conformal mask of TC/DARC over recess 18L, creating a pattern in the non-conformal mask, and subsequently transferring the pattern into substrate 10. FIG. 12 is a perspective view of substrate 10. FIG. 13 is a side view, with higher elevation H features on the left and in the background behind the lower elevation L features that appear on the right. In FIG. 14, lower elevation L features of substrate 10 are in the foreground and higher elevation H features are in the background. The micrographs of FIGS. 12 through 14 demonstrate that when embodiments of the present invention are employed, feature dimensions and, thus, critical dimensions, remain undistorted or substantially undistorted regardless of the topography of the upper surface 16 (FIG. 1) of a substrate 10 over which a mask is formed.

A mask 30 according to embodiments of the present invention may be useful for fabricating a variety of structures, including structures that have conventionally been fabricated using two or more sequential mask-and-removal processes, as well as structures that include relatively deep trenches or other recesses. Various embodiments of structures that may be fabricated in accordance with embodiments of the present invention include, but are not limited to, PSOI structures, epi-diodes for phase change random access memory (PCRAM) devices, cross-hair cell (CHC) type memory devices, NAND Flash memory devices, and other high-voltage devices. Embodiments of the present invention may also be used to fabricate structures in the back-end-of-line (BEOL) processing of semiconductor devices.

A specific embodiment of use of the process depicted by FIGS. 1 through 7 in BEOL processing includes the fabrication of dual damascene copper structures. Initially, with returned reference to FIG. 1, a first pattern 19 of recesses 18 that comprise via holes are formed in the upper surface 16 of a dielectric 14" (FIG. 15) (e.g., an oxide, such as borophosphosilicate glass (BPSG), etc.) of a substrate 10. A mask 30 is then formed over upper surface 16 in accordance with an embodiment of the process described in reference to FIGS. 2 through 6. In embodiments where such processes are used, one or both of a density of vias and a height-aspect ratio of each via may be increased relative to the maximum useful density and/or height-aspect ratio when conventional processes are used. As shown in FIG. 2, the non-conformal film 20 from which mask 30 is formed may have a planar or substantially planar upper surface 22 and, in some embodiments, may bridge recesses 18.

Figure 15:
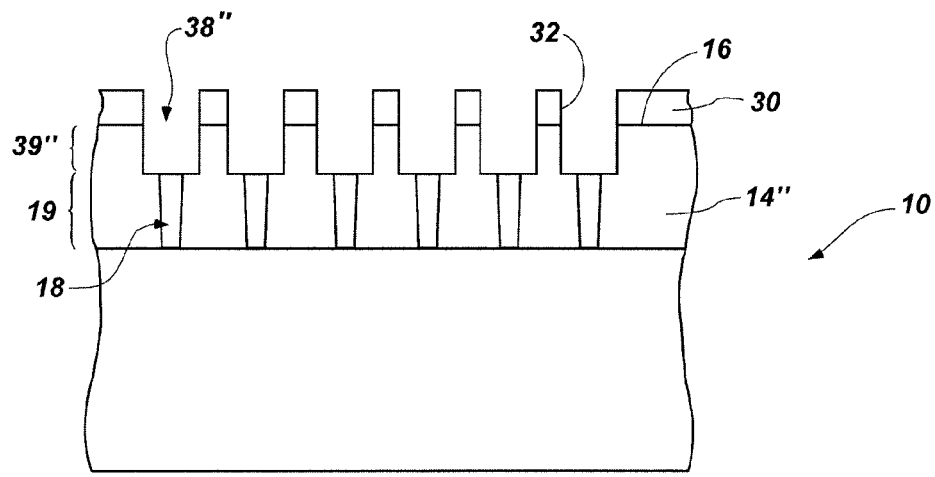
FIGS. 15 through 17 depict an embodiment of back-end-of-line (BEOL) processing that employs various embodiments of mask fabrication and material patterning process of the present invention.

Once mask 30 has been formed, as shown in FIG. 15, additional material may be removed (e.g., by known etch processes, etc.) from dielectric 14" at upper surface 16 of substrate 10, through apertures 32 of mask 30, to define a second pattern 39" of elongate trenches 38" in dielectric 14", which communicate with recesses 18 of first pattern 19. Elongate trenches 38" may be configured to carry conductive lines that communicate with conductive vias that are to be carried by recesses 18.

Figure 16:
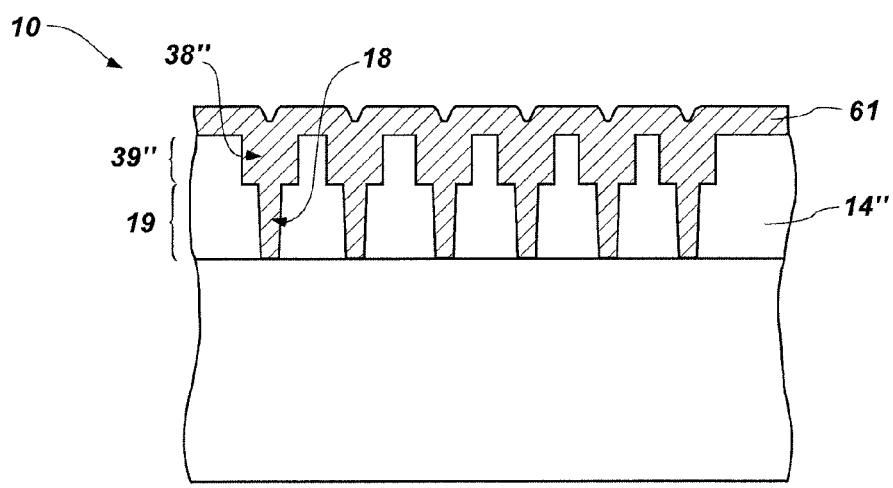

Thereafter, as shown in FIG. 16, recesses 18 of first pattern 19 and recesses 38" of second pattern 39" may concurrently be filled (e.g., by known material deposition processes, etc.) with conductive material 61 to form conductive vias 62 within recesses 18 and conductive lines 64 within recesses 38". In a specific embodiment, conductive material 61 may comprise copper, although other conductive materials could also be used.

Figure 17:
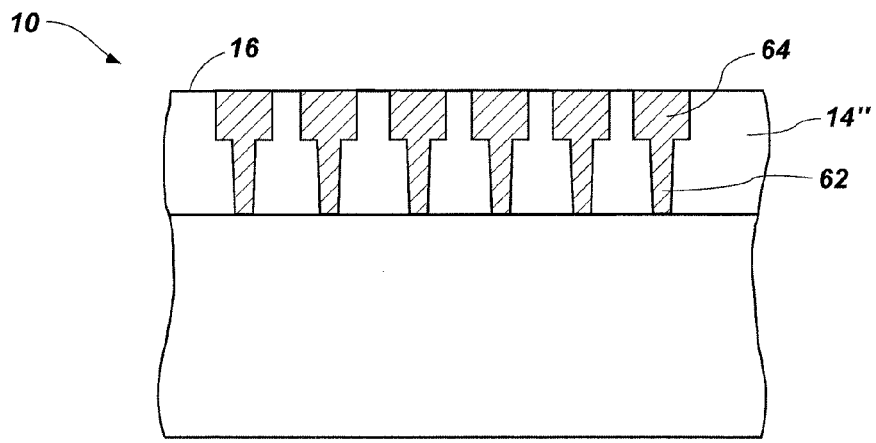

Any conductive material 61 that remains on upper surface 16 of dielectric 14" may then be removed from upper surface 16 to electrically isolate adjacent conductive lines 64 from one another, as shown in FIG. 17. Known processes, such as chemical-mechanical polishing (CMP) or etching, may be used to remove conductive material 61 from upper surface 16.

Although the foregoing description contains many specifics, these should not be construed as limiting the scope of the present invention, but merely as providing illustrations of some embodiments. Similarly, other embodiments that are within the scope of the invention may also be devised. Features from different embodiments may be employed in combination. The scope of the invention is, therefore, indicated and limited only by the appended claims and their legal equivalents, rather than by the foregoing description. All additions, deletions and modifications to the invention as disclosed herein which fall within the meaning and scope of the claims are to be embraced thereby.

What is claimed:

1. A method for masking a semiconductor device structure, comprising:
applying a non-conformal film comprising a transparent carbon to a nonplanar surface of a semiconductor device structure such that the non-conformal film bridges at least one recess in the nonplanar surface of the semiconductor device structure and such that the non-conformal film has having an at least substantially planar exposed surface;
forming a first mask over the at least substantially planar exposed surface of the non-conformal film; and
transferring a pattern of the first mask into the non-conformal film to form a second mask from the non-conformal film.

2. The method of claim 1, wherein applying the non-conformal film comprises forming the non-conformal film without further processing.

3. The method of claim 1, wherein applying the non-conformal film comprises depositing the non-conformal film onto the nonplanar surface of the semiconductor device structure.

4. The method of claim 3, wherein depositing the non-conformal film comprises using a plasma-enhanced chemical vapor deposition process to deposit the non-conformal film onto the non-planar surface of the semiconductor device structure.

5. The method of claim 1, wherein forming the first mask comprises applying an uncured photoresist in a manner permitting an at least substantially constant depth of focus across a region of the uncured photoresist.

6. The method of claim 1, wherein forming the first mask comprises forming a nanoimprint mask over the at least substantially planar exposed surface of the non-conformal film.

7. The method of claim 1, wherein forming the first mask comprises guided self assembly of the first mask.

8. The method of claim 1, further comprising:
removing material from the semiconductor device structure through the second mask.

9. The method of claim 1, further comprising:
forming a conformal material over surfaces of the second mask and over other surfaces exposed through the second mask;
removing the conformal material overlying upper surfaces of the second mask and overlying portions of the other surfaces exposed through the second mask to form a reduced-pitch mask; and
removing the second mask while retaining the reduced-pitch mask.

10. The method of claim 9, further comprising removing material from the semiconductor device structure through the reduced-pitch mask.

11. A method for forming crossing patterns in a semiconductor device structure, comprising:
defining a first pattern in the semiconductor device structure; and
defining a second pattern that crosses the first pattern in the semiconductor device structure, the act of defining the second pattern comprising:
applying a non-conformal film comprising a transparent carbon over the first pattern in the semiconductor device structure such that the non-conformal film bridges at least one recess of the first pattern in the semiconductor device structure and such that the non-conformal film has an at least substantially planar exposed surface;
forming a first mask over the at least substantially planar exposed surface of the non-conformal film;
transferring a pattern of the first mask into the non-conformal film to form a second mask from the non-conformal film; and
removing material of the semiconductor device structure through the second mask to define the second pattern in the semiconductor device structure.

12. The method of claim 11, further comprising filling recesses of each of the first pattern and the second pattern with a conductive material.

13. The method of claim 12, further comprising removing the conductive material from an upper surface of the semiconductor device structure while retaining the conductive material in the recesses of each of the first pattern and the second pattern.

14. A method for masking a semiconductor device structure, comprising:
applying a non-conformal film comprising a transparent carbon to a nonplanar surface of a semiconductor device structure, the non-conformal film having an at least substantially planar exposed surface;
forming a first mask over the at least substantially planar exposed surface of the non-conformal film; and
transferring a pattern of the first mask into the non-conformal film to form a second mask from the non-conformal film.

* * * * *

UNITED STATES PATENT AND TRADEMARK OFFICE
CERTIFICATE OF CORRECTION

| | | |
|---|---|---|
| PATENT NO. | : 8,268,730 B2 | Page 1 of 1 |
| APPLICATION NO. | : 12/477551 | |
| DATED | : September 18, 2012 | |
| INVENTOR(S) | : David H. Wells | |

It is certified that error appears in the above-identified patent and that said Letters Patent is hereby corrected as shown below:

In column 7, line 23, in Claim 1, after "has" delete "having".

Signed and Sealed this
Twentieth Day of November, 2012

David J. Kappos
*Director of the United States Patent and Trademark Office*